US012586993B2

(12) United States Patent
Kloppenburg et al.

(10) Patent No.: US 12,586,993 B2
(45) Date of Patent: Mar. 24, 2026

(54) FASTENING DEVICE, METHOD, ARRANGEMENT AND SWITCHGEAR CABINET

(71) Applicant: Phoenix Contact GmbH & Co. KG, Blomberg (DE)

(72) Inventors: Christian Kloppenburg, Bueren (DE); Reiner Busse, Bielefeld (DE); Wjatscheslaw Janzen, Detmold (DE)

(73) Assignee: PHOENIX CONTACT GMBH & CO. KG, Blomberg (DE)

(*) Notice: Subject to any disclaimer, the term of this patent is extended or adjusted under 35 U.S.C. 154(b) by 361 days.

(21) Appl. No.: 18/040,425

(22) PCT Filed: Aug. 3, 2021

(86) PCT No.: PCT/EP2021/071674
§ 371 (c)(1),
(2) Date: Feb. 3, 2023

(87) PCT Pub. No.: WO2022/029124
PCT Pub. Date: Feb. 10, 2022

(65) Prior Publication Data
US 2023/0318266 A1 Oct. 5, 2023

(30) Foreign Application Priority Data
Aug. 6, 2020 (BE) .................................. 2020/5561

(51) Int. Cl.
*H02B 1/34* (2006.01)
*H02B 1/01* (2006.01)
(Continued)

(52) U.S. Cl.
CPC ............... *H02B 1/34* (2013.01); *H02B 1/012* (2013.01); *H02B 1/042* (2013.01); *H02B 1/052* (2013.01); *H05K 7/183* (2013.01)

(58) Field of Classification Search
CPC ........ H02B 1/012; H02B 1/042; H02B 1/052; H02B 1/34; H05K 7/183
See application file for complete search history.

(56) References Cited

U.S. PATENT DOCUMENTS

| | | | |
|---|---|---|---|
| 4,716,633 A | 1/1988 | Rizo | |
| 6,378,825 B1 * | 4/2002 | Yee ......................... | H02B 1/052 |
| | | | 248/225.11 |

(Continued)

FOREIGN PATENT DOCUMENTS

| | | |
|---|---|---|
| CN | 103532030 A | 1/2014 |
| DE | 2746545 A1 | 4/1979 |

(Continued)

*Primary Examiner* — Timothy J Thompson
*Assistant Examiner* — Rhadames Alonzo Miller
(74) *Attorney, Agent, or Firm* — LEYDIG, VOIT & MAYER, LTD.

(57) ABSTRACT

A fastening device for fastening a DIN rail to a wall includes: at least one fastening element having a wall fastening portion for fastening the fastening element to the wall, and a DIN rail fastening portion for fastening the fastening element to the DIN rail. When in a fastened state, the DIN rail fastening portion is guided at least in some regions through an opening formed in the DIN rail. The DIN rail fastening portion includes a tongue and groove system into which a portion of the DIN rail is inserted in the fastened state.

19 Claims, 9 Drawing Sheets

(51) Int. Cl.

| | | |
|---|---|---|
| *H02B 1/04* | (2006.01) |
| *H02B 1/052* | (2006.01) |
| *H05K 7/18* | (2006.01) |

(56) References Cited

U.S. PATENT DOCUMENTS

| | | | | |
|---|---|---|---|---|
| 8,671,528 B2 | 3/2014 | Hayashi | |
| 2015/0076298 A1* | 3/2015 | Peter ...................... | H02B 1/052 |
| | | | 248/205.1 |
| 2020/0343698 A1* | 10/2020 | Avenhaus .............. | H02B 1/042 |

FOREIGN PATENT DOCUMENTS

| | | | |
|---|---|---|---|
| DE | 3704696 C2 | 3/1998 |
| DE | 102012102170 A1 | 9/2013 |
| DE | 202017106653 U1 | 2/2019 |
| JP | 2006/220267 A | 8/2006 |
| WO | WO 2010/143531 A1 | 12/2010 |

* cited by examiner

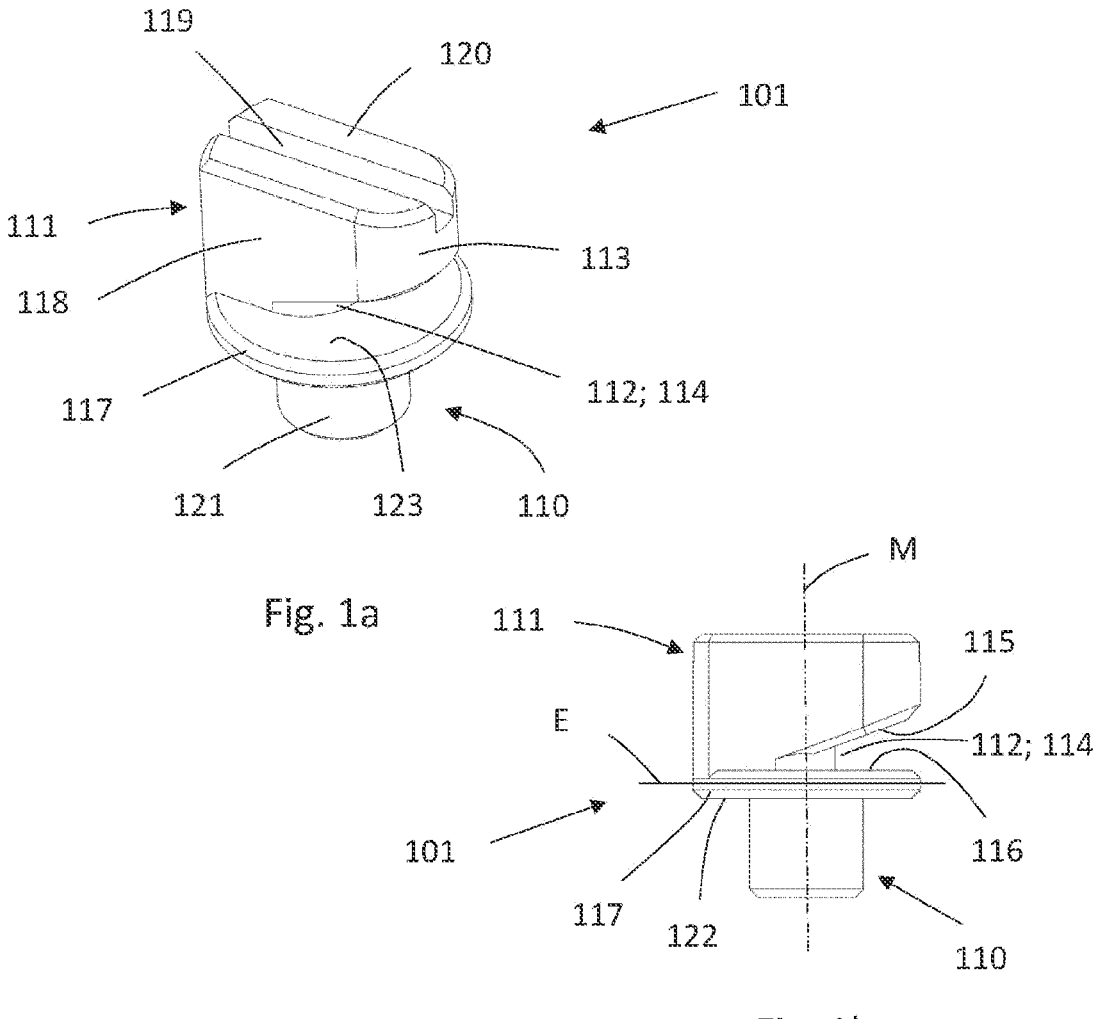
Fig. 1a
Fig. 1b
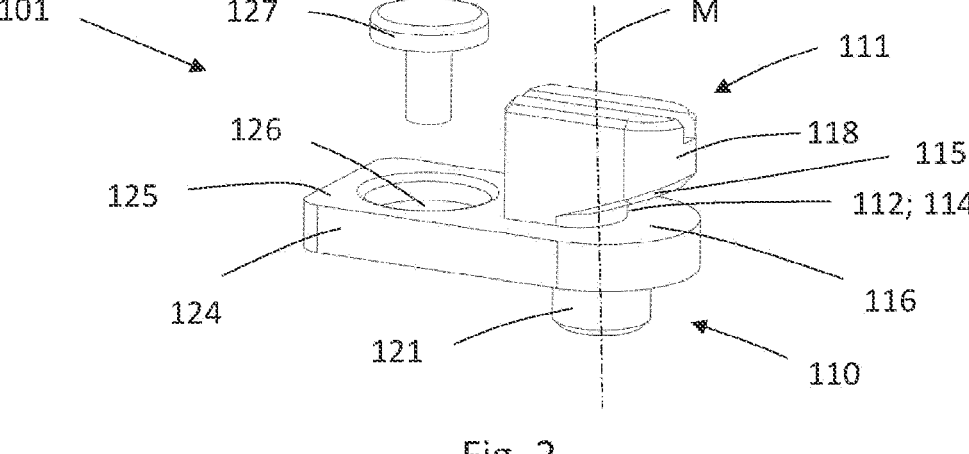
Fig. 2

FASTENING DEVICE, METHOD, ARRANGEMENT AND SWITCHGEAR CABINET

CROSS-REFERENCE TO PRIOR APPLICATIONS

This application is a U.S. National Phase application under 35 U.S.C. § 371 of International Application No. PCT/EP2021/071674, filed on Aug. 3, 2021, and claims benefit to Belgian Patent Application No. BE 2020/5561, filed on Aug. 6, 2020. The International Application was published in German on Feb. 10, 2022 as WO/2022/029124 under PCT Article 21(2).

FIELD

The invention relates to a fastening device for fastening a DIN rail to a wall, for example a wall of a switchgear cabinet. The invention further relates to a method for fastening a DIN rail to a wall by means of a fastening device of this kind, to an assembly, and to a switchgear cabinet comprising a fastening device of this kind.

BACKGROUND

DIN rails can be formed as an elongate U-profile or C-profile and are used for receiving a multiplicity of terminals, in particular terminal blocks. The terminals can be installed in a switchgear cabinet by means of the DIN rails. The DIN rails generally comprise a multiplicity of openings through which the DIN rails can be fastened to a wall of the switchgear cabinet by means of screws. Since the screws are no longer accessible once the DIN rails have been equipped with terminals, the DIN rails first have to be fastened in the switchgear cabinet using the screws, and the DIN rails cannot be equipped with the terminals until the DIN rails have been fastened to or installed on a wall of the switchgear cabinet. A DIN rail pre-assembled with terminals therefore cannot be installed in the switchgear cabinet. Consequently, the DIN rails cannot be equipped in an automated manner. The amount of installation work for equipping a switchgear cabinet with terminals and DIN rails is thus very high.

SUMMARY

In an embodiment, the present invention provides a fastening device for fastening a DIN rail to a wall, comprising: at least one fastening element comprising a wall fastening portion configured to fasten the fastening element to the wall, and a DIN rail fastening portion configured to fasten the fastening element to the DIN rail, wherein, when in a fastened state, the DIN rail fastening portion is guided at least in some regions through an opening formed in the DIN rail, and wherein the DIN rail fastening portion comprises a tongue and groove system into which a portion of the DIN rail is inserted in the fastened state.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 1a is a schematic illustration of a fastening element of a fastening device according to the invention in a first view, FIG. 1b is a schematic illustration of the fastening element shown in FIG. 1a in a second view, FIG. 2 is a schematic illustration of a further fastening element of a fastening device according to the invention.

DETAILED DESCRIPTION

Figure 3:
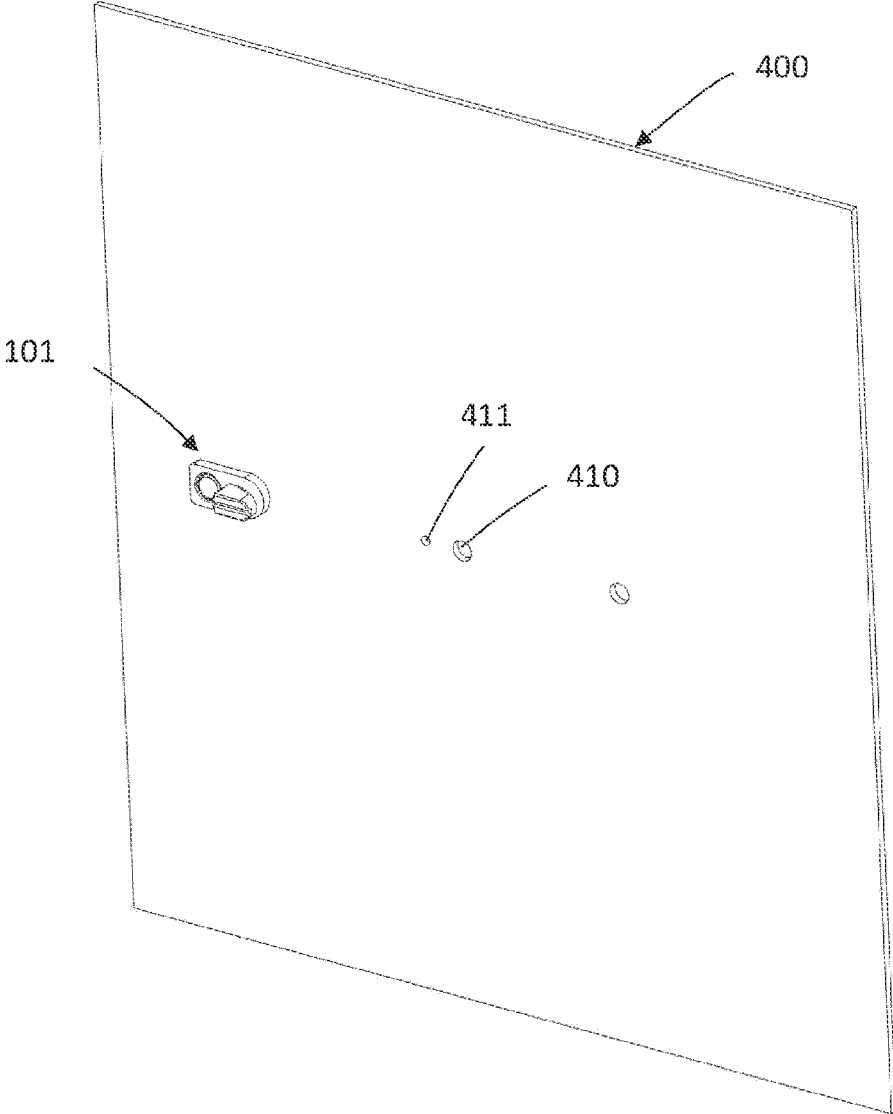
FIG. 3 is a schematic illustration of the fastening element shown in FIG. 2 fastened to a wall.

In an embodiment, the present invention provides a fastening device, a method, an assembly, and a switchgear cabinet in which the amount of installation work can be reduced and, in particular, DIN rails pre-assembled with terminals can be fastened to a wall.

The fastening device according to the invention comprises at least one fastening element, which comprises a wall fastening portion for fastening the fastening element to the wall and a DIN rail fastening portion for fastening the fastening element to the DIN rail. When the fastening element is in the state fastened to the DIN rail, the DIN rail fastening portion is guided at least in some regions through an opening formed in the DIN rail. The DIN rail portion comprises a tongue and groove system into which a portion of the DIN rail is inserted when in the fastened state.

To fasten the DIN rail to a wall, in particular a wall of a switchgear cabinet, a fastening device having at least one fastening element is now provided, the one or more fastening elements first being fastened to a wall, which may also be a mounting plate, for example, and the pre-assembled DIN rail, equipped for example with terminals, then being fastened to the one or more fastening elements and thus to the wall. The DIN rail can be inserted into the fastening element fastened to the wall such that the DIN rail can be retained on and fastened to the wall by being inserted into the fastening element of the fastening device. Fasteners, for example a plurality of screws, that are otherwise commonplace need no longer be fastened to the DIN rail in order to fasten the DIN rail to the wall. This allows the DIN rail to be installed on a wall much more simply. The DIN rail can be directly screwed to the wall, for example by means of a securing element such as a screw, only at an end portion of the DIN rail where there are no terminals latched to the DIN rail, so as to be able to prevent the DIN rail from inadvertently slipping out of the tongue and groove system of the fastening elements. The fastening element comprises two portions: the DIN rail fastening portion and the wall fastening portion. The DIN rail fastening portion is formed to directly abut the wall fastening portion. The terminals are latched to the DIN rail in the region of a top face of the DIN rail. The DIN rail is installed on the wall via an underside of the DIN rail, said underside being opposite the top face and specifically having no terminals latched thereto. By way of the underside, the fastening element is guided by its DIN rail fastening portion through an opening in the DIN rail such that, in the fastened state, the fastening element passes through the opening in the DIN rail by its DIN rail fastening portion at least in some regions. The DIN rail preferably comprises a plurality of said openings along its length, it being possible to arrange one such fastening element in every opening so as to fasten the DIN rail to the wall. The fastening device can thus also comprise two or more such fastening elements. The openings in the DIN rail are preferably each elongate so that they are greater in length than in width. Along its length the DIN rail fastening portion comprises a tongue and groove system into which a DIN rail portion abutting the opening can be inserted during installation such that, when in the fastened state, the DIN rail is engaged with the tongue and groove system and is retained on the fastening device by means of the fastening element of the fastening device by way of the tongue and groove system. The DIN rail can thus be retained on and fastened to the fastening element of the fastening device, and thus the wall, by means of a simple interlocking connection. Using a fastening device of this kind, DIN rails already equipped with terminals (also referred to as pre-assembled DIN rails) can be fastened to a wall quickly and simply and thus with little installation work.

The tongue and groove system may be in the form of a recess formed in an external circumferential surface of the DIN rail fastening portion. The DIN rail fastening portion may have a cylindrical and thus elongate shape, which may, for example, have a round or elliptical cross section. The recess can be formed on the external circumferential surface of said cylindrical shape. The recess may be in the form of a notch in the external circumferential surface of the DIN rail fastening portion. The recess extends from the external circumferential surface toward a central axis of the DIN rail fastening portion.

The recess may taper from the external circumferential surface of the DIN rail fastening portion toward the central axis of the DIN rail fastening portion. Owing to the taper, the DIN rail portion can be inserted into the tongue and groove system in a targeted manner. In addition, inserting the DIN rail portion into the tongue and groove system can be made simpler.

The recess may be delimited by a first wall surface and by a second wall surface opposite the first wall surface, it being possible for the first wall surface to be in the shape of a ramp. The first wall surface may form an oblique face due to the ramp shape. By contrast, the second wall surface preferably is not in the shape of a ramp. The second wall surface preferably extends in a horizontal plane that extends transversely to the central axis of the DIN rail fastening element. The first wall surface may, for example, extend in a manner inclined with respect to the second wall surface at an angle of between 30° and 70°, preferably between 40° and 60°. Tolerances of the DIN rail can be compensated for by the ramp shape. In addition, DIN rails of different material thicknesses can consequently be fastened to the fastening element of the fastening device. Moreover, a practically zero-play connection can thus be achieved between the fastening element and the DIN rail, and thus between the fastening device and the DIN rail.

To simplify the handling of the fastening element of the fastening device, the DIN rail fastening portion may comprise a tool holder region. The tool holder region may, for example, be in the form of a slot in which a tool such as a screwdriver can engage. The tool holder region may be formed on an end face of the DIN rail fastening portion.

The DIN rail fastening portion is preferably formed in one piece with the wall fastening portion. The entire fastening element is thus preferably produced as a single piece.

To fasten the fastening element to the wall, the wall fastening portion may comprise an engagement pin for engaging in a first opening formed in the wall. By means of the engagement pin, a simple interlocking connection between the fastening element and the wall is possible. The engagement pin is preferably elongate. The engagement pin may have a cylindrical shape. In a state installed on the wall, the engagement pin can enter the first opening in the wall.

The fastening element may also comprise a retaining element which, in the fastened state, can be retained on a flange of the wall fastening portion and engage in a second opening formed in the wall. This can result in increased stability in the fastening of the fastening element to the wall. The retaining element is preferably provided in addition to the engagement pin such that the fastening element can be fastened to the wall via two points: the retaining element and the engagement pin. By way of example, the retaining element may be a screw or a rivet which can be retained on the flange, and thus on the wall fastening portion, via an opening formed in the flange.

Furthermore, the fastening device may comprise a securing element in addition to the fastening element. The securing element is preferably arranged separately, and thus at a distance, from the fastening element. Using the securing element, the DIN rail can be prevented from inadvertently slipping out of or releasing from the fastening element. The securing element can be fastened directly to the wall and directly to the DIN rail. The securing element is preferably arranged on a DIN rail end at which no more terminals or the like are latched. The securing element may be a screw, for example. However, it is also possible, for example, for the securing element to be formed identically to the fastening element. The securing element formed identically to the fastening element may then, for example, be fastened to the wall and to the DIN rail in a manner rotated through 180° relative to the actual fastening element, so as to be able to generate a blocking action against any shifting or slipping movement of the DIN rail.

The DIN rail fastening portion may comprise a securing lug that engages in the opening in the DIN rail in the fastened state. In the fastened state, the securing lug can then engage in the same opening in the DIN rail together with the main body of the DIN rail fastening portion. When the DIN rail is slid into its end position, and thus into the fastened state, the securing lug can be placed into the contour of the opening such that, in the state in which the securing lug engages in the opening in the DIN rail, the DIN rail can be prevented from inadvertently sliding or slipping. The external contour of the securing lug may be adapted to the contour of the opening at least in some regions. If a securing lug of this kind is provided, a securing element arranged separately from the fastening element is no longer needed.

Preferably, the securing lug may be formed in a spring-loaded manner. As a result, when the DIN rail is slid into the fastened state, the securing lug can spring into the opening in the DIN rail when the fastened state is reached, so as to be able to latch onto the DIN rail and thus prevent an inadvertent sliding movement of the DIN rail back out of the fastened state.

The securing lug may comprise a stop surface against which an edge portion, which delimits the opening, of the DIN rail may rest in the fastened state. Owing to the stop surface, the securing lug can be positioned on the DIN rail in a defined manner in the fastened state. The stop surface is preferably formed on an edge region of the securing lug. In the region of the stop surface, the securing lug may comprise a step.

The flange may comprise two centering ribs extending in parallel with one another for orienting the DIN rail on the fastening element. The centering ribs may be formed such that they can extend along the length of the DIN rail. The two centering ribs may be spaced apart from one another so far that the DIN rail can be received between the two centering ribs. Owing to the two centering ribs, the flange may form a U-profile in cross section.

In an embodiment the present invention provides a method for fastening a DIN rail to a wall by means of a fastening device as described, formed, and developed above, in which the at least one fastening element of the fastening device is fastened to the wall by means of its wall fastening portion, the at least one fastening element of the fastening device is guided, by means of its DIN rail fastening portion, at least in some regions through an opening formed in the DIN rail, and the DIN rail is then inserted into the tongue and groove system of the DIN rail fastening portion by a portion of the DIN rail using a sliding movement.

In an embodiment the present invention provides an assembly comprising a DIN rail and a fastening device as described, formed, and developed above, the DIN rail being fastened to the wall by means of the fastening device in order to retain the DIN rail on a wall. Preferably, a plurality of fastening elements of the fastening device may be provided along a length of the DIN rail such that the DIN rail can be fastened to the wall with high stability and high levels of safety. The fastening elements of a fastening device that are arranged along a length of the DIN rail are preferably arranged at a distance from one another.

In an embodiment the present invention provides a switchgear cabinet comprising at least one assembly as described, formed, and developed above that is fastened to a wall of the switchgear cabinet.

FIGS. 1a and 1b show an embodiment of a fastening element 101 of a fastening device 100 by means of which a DIN rail 200 can be fastened to a wall 400.

The fastening element 101 comprises a wall fastening portion 110 by means of which the fastening element 101 can be fastened to the wall 400. The fastening element 101 also comprises a DIN rail fastening portion 111 by means of which the fastening element 101 can be fastened to a DIN rail 200. The DIN rail fastening portion 111 directly abuts the wall fastening portion 110. The DIN rail fastening portion 111 is formed in one piece with the wall fastening portion 110.

The DIN rail fastening portion 111 comprises a main body 118 which has a substantially cylindrical shape, this cylindrical shape having an elliptical cross section.

A tongue and groove system 112 is formed on the DIN rail fastening portion 111, and a portion 210 of the DIN rail 200 can be inserted into said tongue and groove system in order to fasten the DIN rail 200 to the fastening element 101. The tongue and groove system 112 constitutes an undercut. The tongue and groove system 112 is in the form of a recess 114 formed in the external circumferential surface 113 of the DIN rail fastening portion 111. The recess 114 and thus the tongue and groove system 112 extend from the external circumferential surface 113 toward a central axis M of the DIN rail fastening portion 111. In the embodiment shown here, the tongue and groove system 112 extends so far into the DIN rail fastening portion 111 that the tongue and groove system 112 extends as far as the central axis M.

The recess 114 forming the tongue and groove system 112 is shaped such that the recess 114 tapers from the external circumferential surface 113 toward the central axis M. The taper is formed in that one of the wall surfaces 115, 116 delimiting the recess 114 is in the shape of a ramp. The first wall surface 115 is in the shape of a ramp whereas the second wall surface 116 extends in a horizontal plane E. The horizontal plane E extends transversely to the central axis M. Owing to the ramp shape, the first wall surface 115 is formed so as to extend obliquely such that the first wall surface 115 preferably extends at an angle of between 30° and 60° to the second wall surface 116.

The wall fastening portion 110 abuts the second wall surface 116.

The second wall surface 116 forms a planar bearing surface for the portion 210 of the DIN rail 200. The second wall surface 116 juts out from the first wall surface 115 in some regions, as can be seen in FIGS. 1a and 1b.

The second wall surface 116 is formed on a collar 117, which overlaps the main body 118 of the DIN rail fastening portion 111 in some regions. The first wall surface 115 is formed on the main body 118. Unlike the main body 118, the collar 117 is circular at least in some regions. The main body 118 is formed on the collar 117 so as to be off-center with respect to the collar 117.

A tool holder region 119 is formed on the DIN rail fastening portion 111. The tool holder region 119 is formed on an end face 120 of the DIN rail fastening portion 111 or of the main body 118 of the DIN rail fastening portion 111. The tool holder region 119 is in the form of a slot-like recess or an elongate groove in which a tool such as a screwdriver can engage.

The wall fastening portion 110 comprises an engagement pin 121 by means of which the wall fastening portion 100 can engage in a first opening 410 formed in the wall 400. The engagement pin 121 has a cylindrical shape. The engagement pin 121 extends away from the collar 117 starting from an underside 122 of the collar 117. The second wall surface 116 is formed on a top face 123 of the collar 117, said top face being on the opposite side to the underside 122. The main body 118 is also joined to the top face 123 of the collar 117 and extends away from the collar 117 starting from the top face 123 of the collar 117.

The engagement pin 121 has a smaller diameter than the collar 117.

The central axis M forms the central axis M for both the DIN rail fastening portion 111 and the wall fastening portion 110.

In the embodiment of a fastening element 101 of a fastening device 100 as shown in FIG. 2, no collar is provided but the wall fastening portion 110 comprises a flange 124. The second wall surface 116 of the DIN rail fastening portion 111 is formed on a top face 125 of the flange 124 that faces toward the DIN rail fastening portion 111. In this embodiment too, the second wall surface 116 extends in the horizontal plane E and thus transversely to the central axis M.

An opening 126 is formed in the flange 124, and a retaining element 127 can be retained in said opening, the retaining element 127 being a rivet in this case. The retaining element 127 can be fastened in a second opening 411 in the wall 400. By means of the engagement pin 121 and the retaining element 127, the fastening element 101 can comprise two fastening points in relation to the wall 400.

Otherwise, the embodiment shown in FIG. 2 is identical to the embodiment shown in FIGS. 1a and 1b.

FIG. 3 shows a wall 400 to which a DIN rail 200, in particular a pre-assembled DIN rail 200, can be fastened. In this case, the wall comprises openings 410, 411 arranged in pairs, such that a fastening element 101 as shown in FIG. 2 can be fastened to the wall 400.

When installing a DIN rail 200 on the wall 400, the fastening elements 101 of the fastening device 100 are first fastened to the wall 400 by inserting the wall fastening portion 110 of each fastening element 100 into the first opening 410 by the engagement pin 121 and, where applicable, additionally inserting the retaining element 127 into the second opening 411 in the wall 400.

Figure 4:
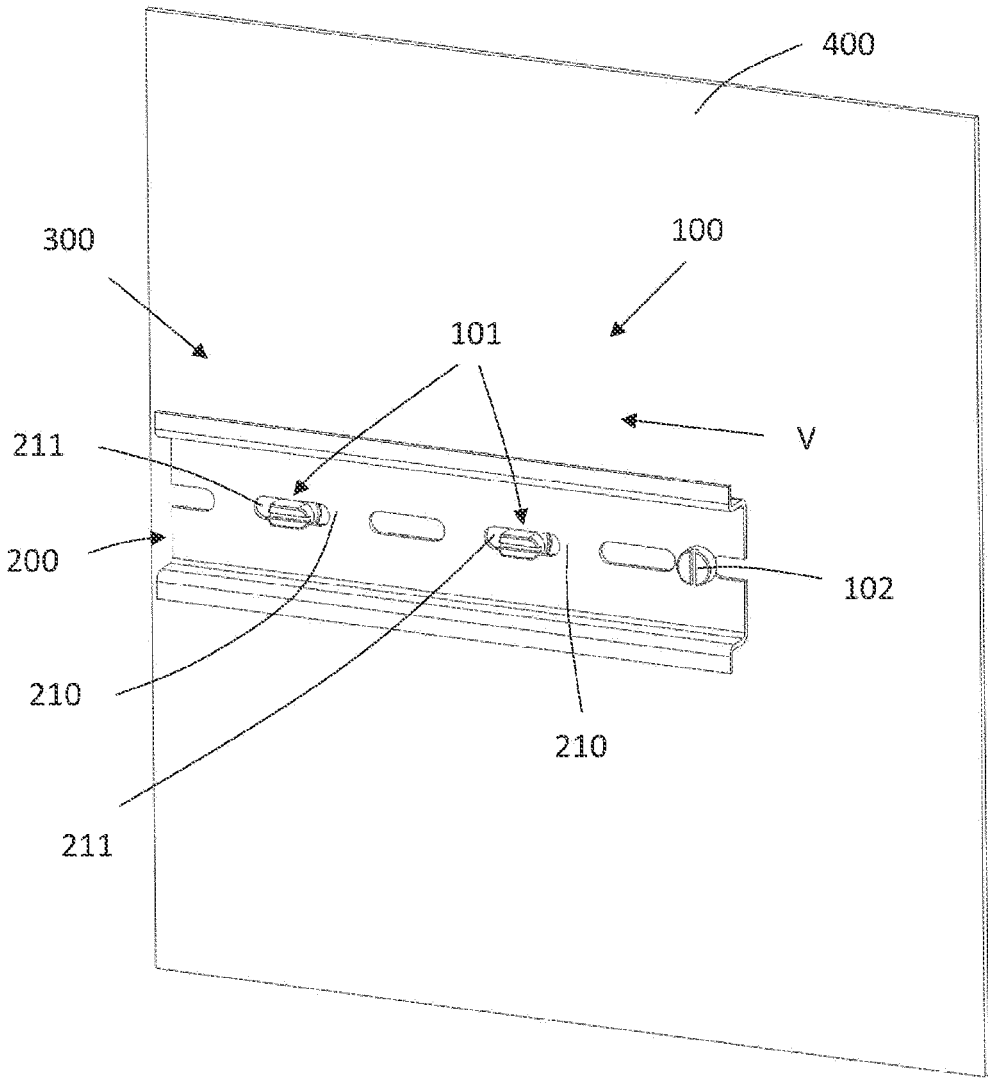
FIG. 4 is a schematic illustration of fastening elements shown in FIGS. 1a and 1b fastened to a wall during insertion of a DIN rail into the tongue and groove system of the fastening elements.

Next, the DIN rail 200 is fastened to the fastening elements 101, which have already been fastened to the wall 400. In the process, the DIN rail 200 is mounted on the fastening elements 101 such that each DIN rail fastening portion 111 is guided through a respective opening 211 formed in the DIN rail 200, as shown in FIG. 4. At this point, the DIN rail fastening portion 111 is still at a distance from the portion 210 of the DIN rail 200 that is used to actually fasten the DIN rail 200 to the fastening element 101.

Figure 5:
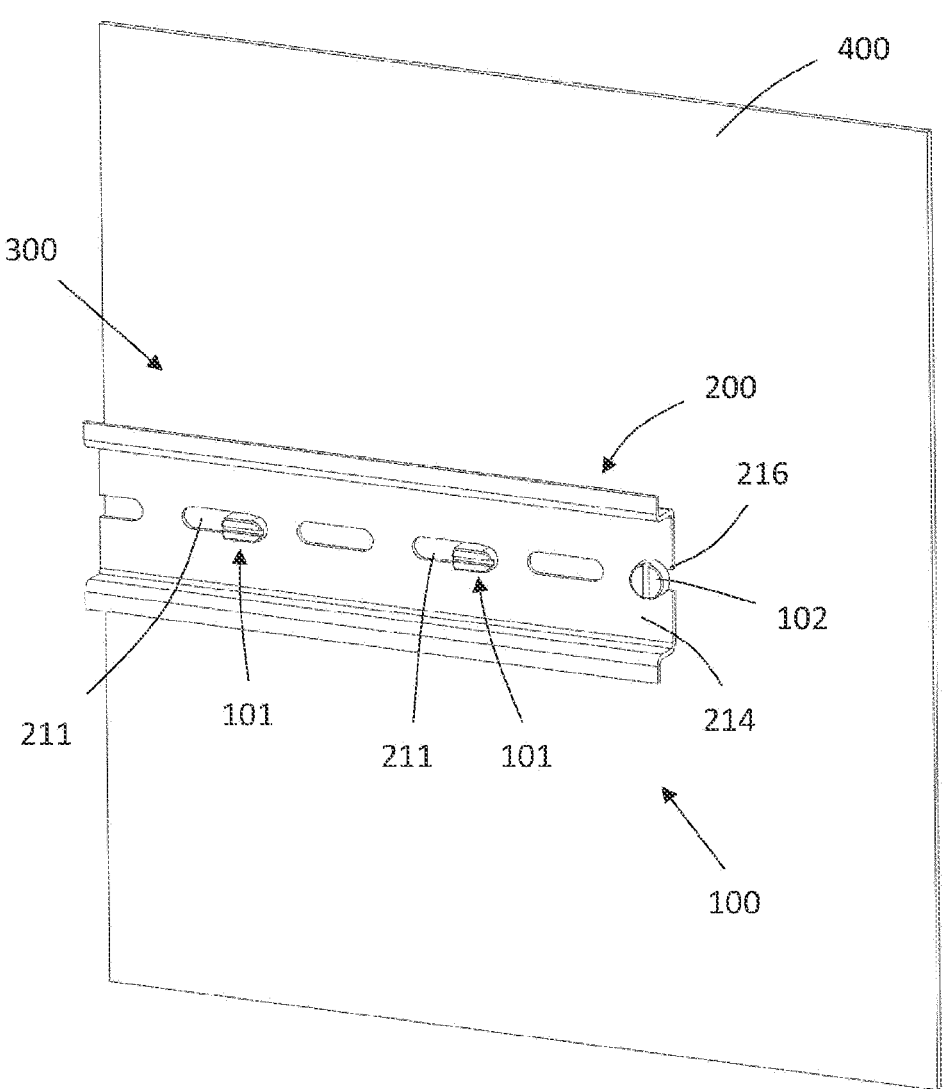
FIG. 5 is a schematic illustration of an assembly according to the invention in a state installed on a wall, comprising fastening elements as shown in FIGS. 1a and 1b and a securing element of the fastening device.

To reach the end fastening state, a sliding movement V of the DIN rail 200 is carried out such that the portion 210 of the DIN rail 200 that is formed to abut the opening 211 is inserted into the tongue and groove system 112 of the DIN rail fastening portion 111 of the fastening element 101. The inserted state is shown in FIG. 5. Where there are a plurality of fastening elements 101, the DIN rail 200 is simultaneously inserted into the tongue and groove system 112 of the particular fastening element 101 by the relevant portion 210 of the DIN rail 200.

The fastening device 100 may comprise a securing element 102 in addition to the one or more fastening elements 101. The securing element 102 is provided in the form of a component that is additional to the one or more fastening elements 101. The DIN rail 200 can be secured on the wall 400 by means of the securing element 102, which is in the form of a screw in FIGS. 5 and 6, at an end portion 214 of the DIN rail 200 such as to prevent the DIN rail 200 from inadvertently slipping out of the tongue and groove system of the fastening elements 101. The securing element 102 engages with the end portion 214 of the DIN rail 200 through an opening 216. In this case, the opening 216 is not formed as an oblong hole, unlike the opening 211.

FIG. 5 shows a corresponding assembly 300 of fastening elements 101 and a DIN rail 200 in the fastened or inserted state, the fastening elements 101 being formed in the same way as the embodiment shown in FIGS. 1a and 1b.

Figure 6:
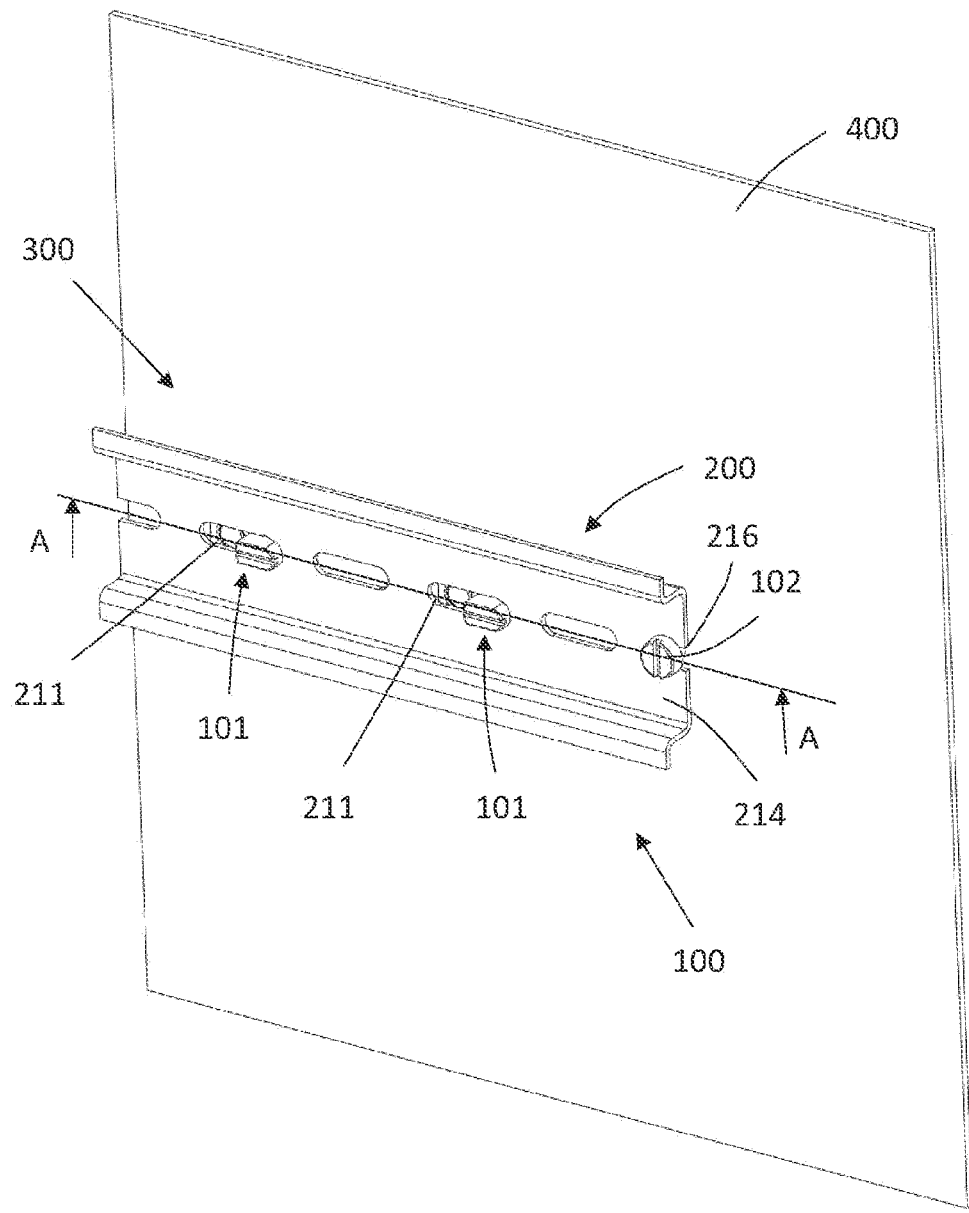
FIG. 6 is a schematic illustration of an assembly according to the invention in a state installed on a wall, comprising fastening elements as shown in FIG. 2.

FIG. 6 shows a corresponding assembly 300 of fastening elements 101 and a DIN rail 200 in the fastened or inserted state, the fastening elements 101 being formed in the same way as the embodiment shown in FIG. 2.

Figure 7:
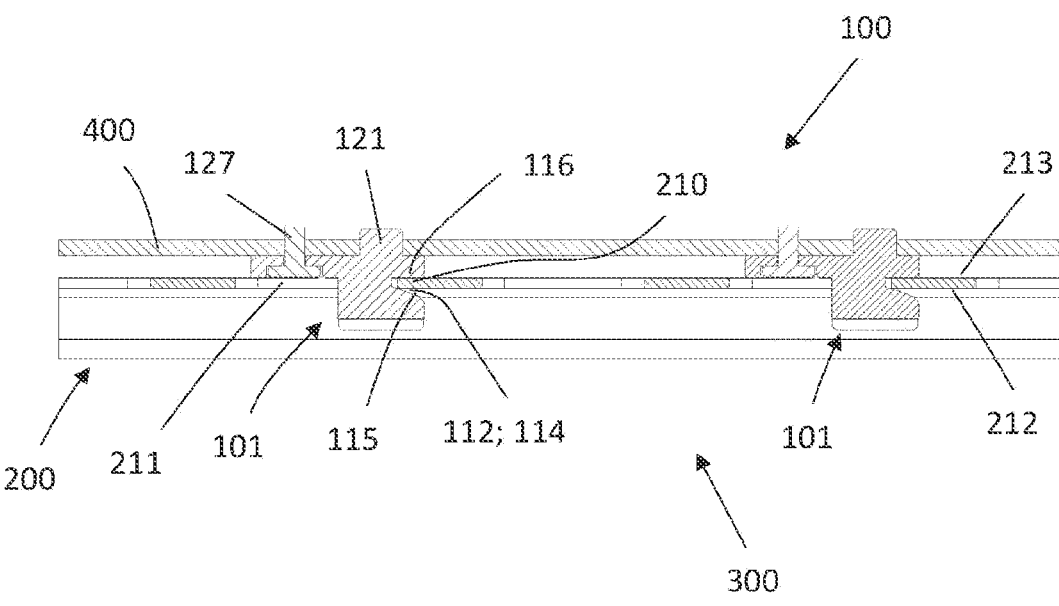
FIG. 7 is a schematic sectional view, along the line A-A, of the assembly shown in FIG. 6 installed on a wall.

FIG. 7 is a sectional view along the line A-A highlighted in FIG. 6. The engagement of the DIN rail 200, by its portion 210, in the tongue and groove system 112 of the fastening element 101 can be seen in this figure. In the fastened state, the fastening element 101 rests, by its first wall surface 115, against a top face 212 of the DIN rail 200; terminals are also latched to the DIN rail 200 by way of said top face. In the fastened state, the fastening element 101 rests against the underside 213 of the DIN rail 200 by its second wall surface 116. The DIN rail 200 is fastened to the fastening elements 101 by means of the underside 213 of the DIN rail 200 by mounting the DIN rail 213 on the fastening elements 101 by its underside 213 in such a way that the DIN rail fastening portion 111 of a fastening element 101 can enter an opening 211 in the DIN rail 200 starting from the underside 213 of the DIN rail 200 toward the top face 212 of the DIN rail 200.

Figure 8A:
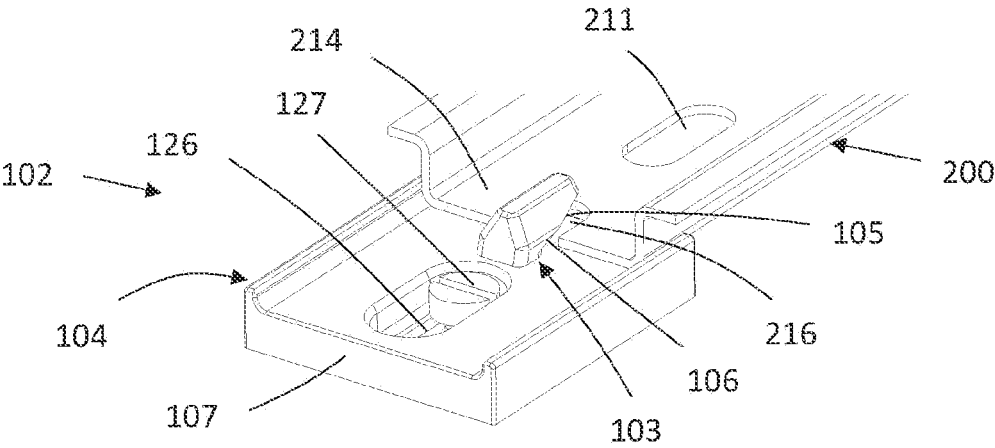
FIG. 8a is a schematic illustration of a further securing element during installation, together with the DIN rail.
Figure 8B:
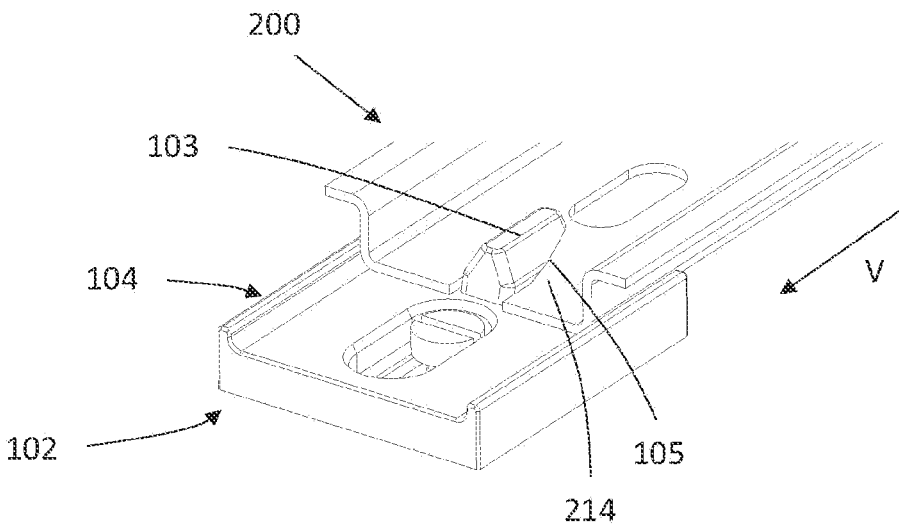
FIG. 8b is a schematic illustration of the securing element shown in FIG. 8a in the fastened state.
Figure 9:
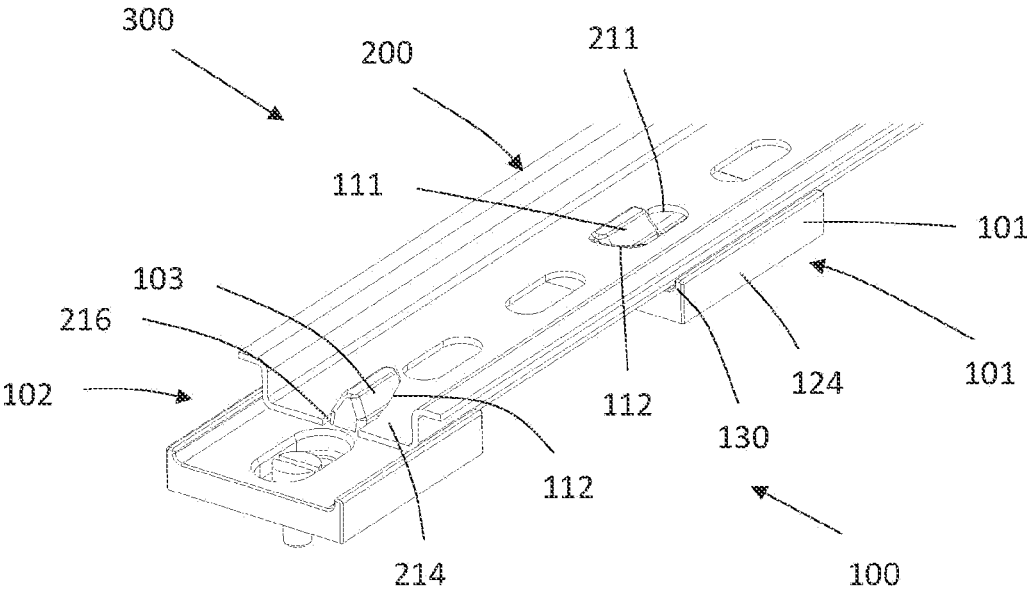
FIG. 9 is a schematic illustration of an assembly according to the invention comprising a securing element as shown in FIGS. 8a and 8b.

In the embodiment shown in FIGS. 8a and 8b, the securing element 102 is formed similarly to a fastening element 101, in particular similarly to a fastening element 101 as shown in FIG. 9.

In this case too, the securing element 102 comprises a DIN rail fastening portion 103 and a wall fastening portion 104. The DIN rail fastening portion 103 comprises a tongue and groove system 105 into which a part of the DIN rail fastening portion 200 as shown in FIGS. 8a and 8b can be inserted. The tongue and groove system 105 constitutes an undercut. The tongue and groove system 105 is in the form of a recess 106 formed in the external circumferential surface of the DIN rail fastening portion 103. In this case, the recess 106 and thus the tongue and groove system 105 are formed identically to the recess 114 and the tongue and groove system 112 of the fastening element 101. The recess 106 tapers toward the central axis of the DIN rail fastening portion 103.

The wall fastening portion 104 comprises a flange 107 in which an opening 108 is formed, in which a retaining element 109 in the form of a screw is arranged in order to fasten the securing element 102 to a wall 400 by means of its wall fastening portion 104.

The DIN rail 200 is inserted into the tongue and groove system 105 of the DIN rail fastening portion 103 of the securing element 102 by its end portion 214. This occurs in the region of the opening 216 in the end portion 214 of the DIN rail 200. In this case, the opening 216 is formed in an open manner such that the opening 216 has a U shape. By forming the opening 216 to be open on one side, the DIN rail fastening portion 103 of the securing element 102 can be inserted so far into the opening 216 that the DIN rail 200 enters the tongue and groove system 105 and is thus latched to the tongue and groove system 105.

FIG. 9 shows an assembly 300 comprising a DIN rail 200 and a fastening device 100; in this case, a fastening element 101 and a securing element 102 of the fastening device 100 can be seen. The securing element 102 is formed in accordance with the embodiment shown in FIGS. 8a and 8b. The fastening element 101 is formed identically to the securing element 102. To obtain the blocking action of the securing element 102, the securing element 102 is arranged in a manner rotated through 180° relative to the identically formed fastening element 101.

The flange 124 of the fastening element 101 is U-shaped in cross section such that the DIN rail 200 can be inserted into the U-shaped cross section of the flange 124 of the wall fastening portion 110, as can be seen in FIG. 9. To form the U shape, the flange 124 comprises two centering ribs 130 which are arranged in parallel with one another and between which the DIN rail 200 is inserted such that the DIN rail 200 can be prevented from slipping or tipping sideways on the flange 124.

The DIN rail fastening portion 111 of the fastening element 101 is formed identically to the DIN rail fastening portion 103 of the securing element 102. Moreover, the wall fastening portion 110 of the fastening element 101 is formed identically to the wall fastening portion 104 of the securing element 102.

FIGS. 10 to 13 show an embodiment in which the fastening device 100 comprises fastening elements 101 but no securing element 102. The fastening elements 101 each comprise a securing lug 128; the securing lug 128 takes on the function of the securing element 102, so the securing element 102 need no longer be provided.

Figure 10:
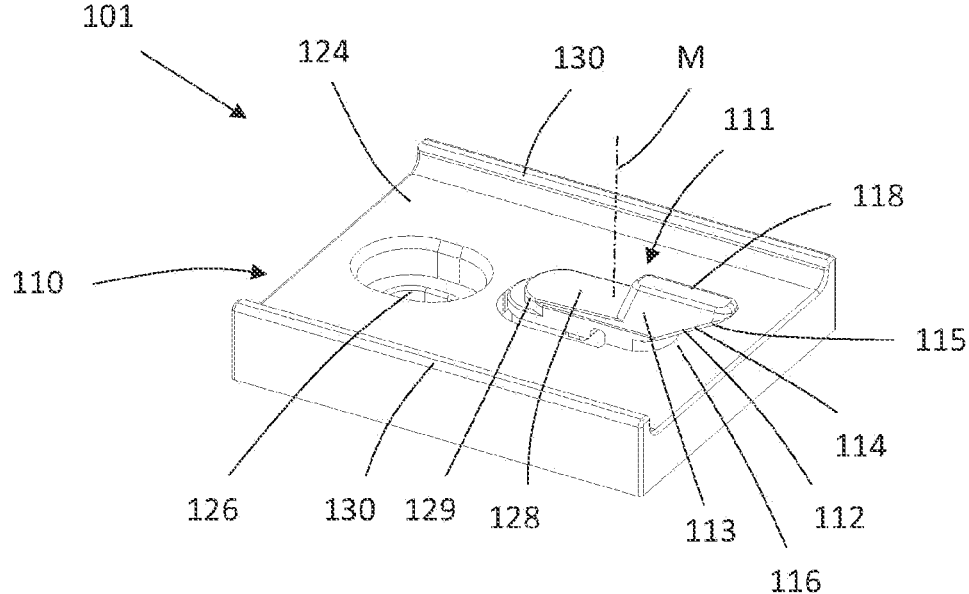
FIG. 10 is a further schematic illustration of a fastening device according to the invention.
Figure 11:
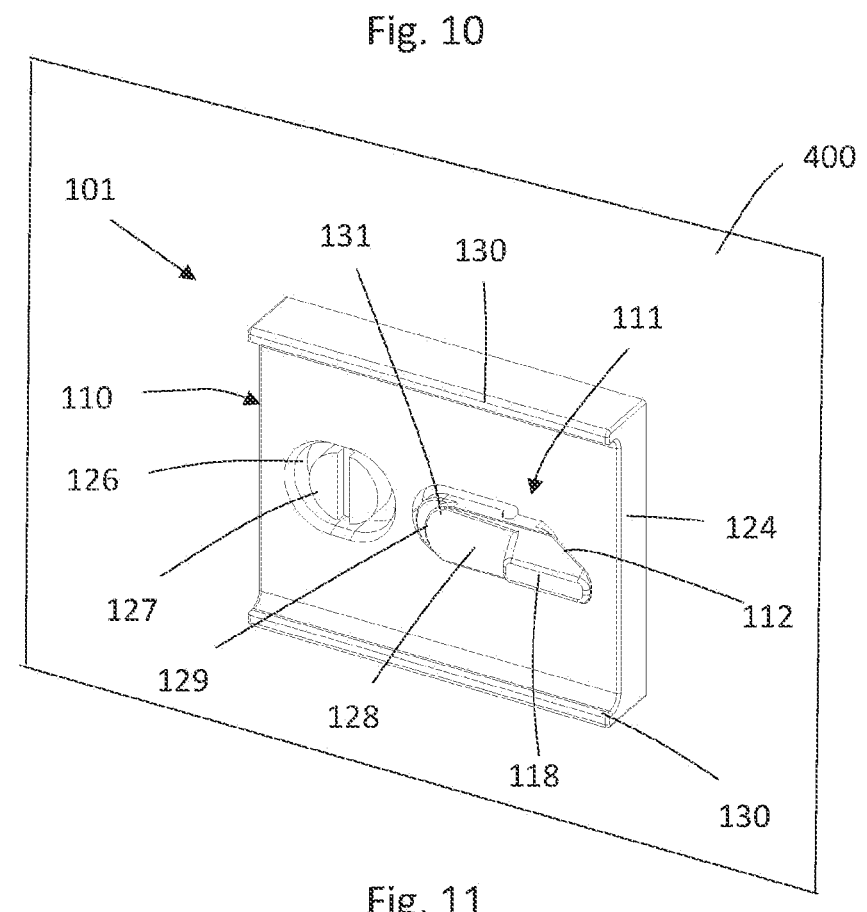
FIG. 11 is a schematic illustration of the fastening device shown in FIG. 10 fastened to a wall.

FIG. 10 shows an embodiment of a fastening element 101 in which the flange 124 of the wall fastening portion 110 has a U shape in cross section since the flange 124 comprises two centering ribs 130 extending in parallel with one another. In addition, an opening 126 is formed in the flange 124, and a retaining element 127 can be arranged in said opening, as can be seen in FIG. 11, in order to fasten the fastening element 101 to the wall 400 by means of the wall portion 110. In the embodiment shown in FIG. 11, the retaining element 127 is a screw.

The DIN rail fastening portion 111 is formed in one piece with the wall fastening portion 110.

The DIN rail fastening portion 111 comprises a main body 118.

A tongue and groove system 112 is formed on the DIN rail fastening portion 111 in the region of the main body 118, and a portion 210 of the DIN rail 200 can be inserted into said tongue and groove system in order to fasten the DIN rail 200 to the fastening element 101. The tongue and groove system 112 constitutes an undercut. The tongue and groove system 112 is in the form of a recess 114 formed in the external circumferential surface 113 of the DIN rail fastening portion 111. The recess 114 and thus the tongue and groove system 112 extend from the external circumferential surface 113 toward a central axis M of the DIN rail fastening portion 111.

The recess 114 forming the tongue and groove system 112 is shaped such that the recess 114 tapers from the external circumferential surface 113 toward the central axis M. The taper is formed in that the wall surface 115 delimiting the recess 114 is in the shape of a ramp. As a result of this taper of the recess 114, and thus of the tongue and groove system 112, DIN rails 200 of different thicknesses can be fastened to or inserted into the DIN rail fastening portion 111.

In the embodiments shown in FIGS. 10 to 13, a securing lug 128 is formed on the main body 118 of the DIN rail fastening portion 111. The securing lug 128 is formed on the main body 118 such that the securing lug 128 extends away from the tongue and groove system 112. The securing lug 128 is thus formed on the main body 118 at a distance from the tongue and groove system 112. The main body 118 juts out from the securing lug 128 starting from the flange 124 such that the main body 118 has a greater height than the securing lug 128.

The securing lug 128 is formed in a spring-loaded manner. The securing lug 128 is formed in a spring-loaded manner such as to be springy transversely to the direction of the sliding movement V of the DIN rail 200. To generate the spring-loaded properties of the securing lug 128, it is cut free at least in part and joined to the flange 124 only by means of the main body 118. There is no direct connection between the securing lug 128 and the flange 124, as can be seen in the sectional view in FIG. 13. The securing lug 128 is elongate. The securing lug 128 is in the shape of a tongue.

Figure 13:
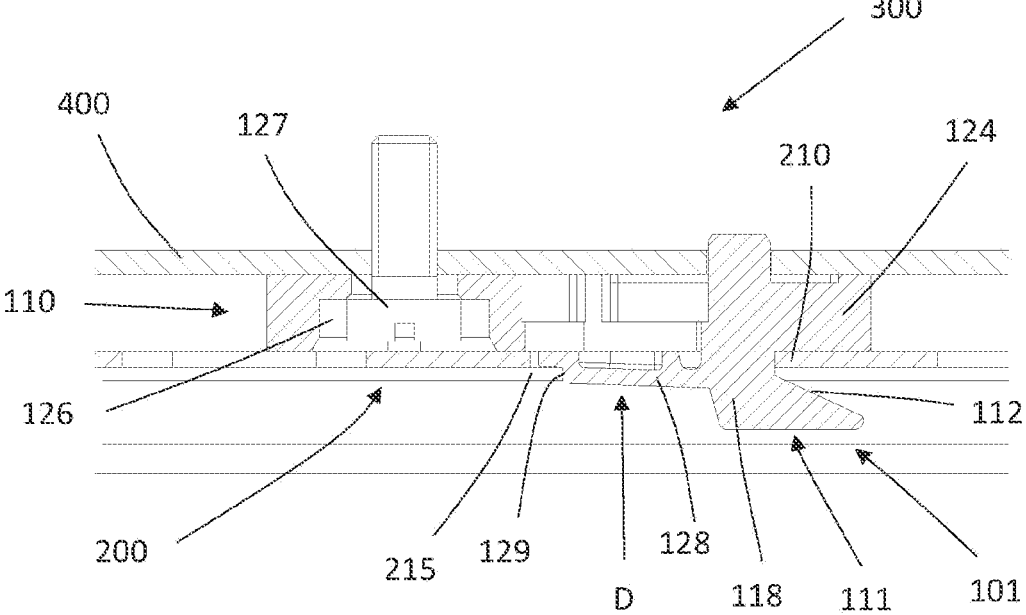
FIG. 13 is a schematic sectional view of the assembly shown in FIG. 12 installed on a wall, with the DIN rail in a fastened state, comprising a fastening device as shown in FIGS. 10 to 12.

At an edge region 131, the securing lug 128 comprises a stop surface 129 against which an edge portion 215 delimiting the opening 211 in the DIN rail 200 rests or bears in the fastened state, as can be seen in FIG. 13. In the region of the stop surface 129, the securing lug 128 comprises a step in order to ensure that the edge portion 215 of the DIN rail 200 securely rests against the securing lug 128 when in the fastened state.

Figure 12:
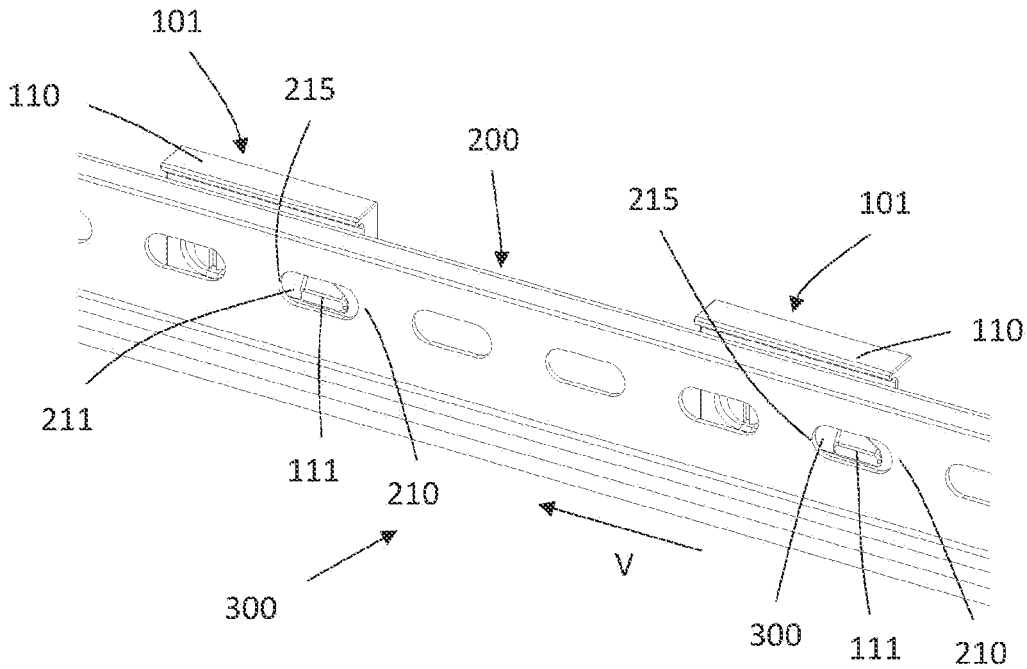
FIG. 12 is a schematic illustration of an assembly according to the invention during fastening of the DIN rail to two fastening devices as shown in FIG. 10.

FIG. 12 shows the assembly 300 in an as yet unfastened state whereas FIG. 13 shows the assembly 300 in the fastened state. To fasten the DIN rail 200, it is slid axially by a sliding movement V; during this sliding movement V, the DIN rail 200 is slid along the flange 124 of the wall fastening portion 110 between the two centering ribs 130. The DIN rail 200 is slid until such a point as the entire DIN rail fastening portion 111, and thus also the securing lug 128 of the DIN rail fastening portion 111, enters or springs into the opening 211 in the DIN rail 200. In the process, the DIN rail 200 is slid such that the DIN rail 200 enters the tongue and groove system 112 of the main body 118 and latches or hooks therein.

FIG. 13 shows the fastened state, in which the securing lug 128 has sprung into the opening 211 in the DIN rail 200 in such a way that the DIN rail 200 rests, in particular bears, against the stop surface 129 by its edge portion 215. In the fastened state as shown in FIG. 13, the DIN rail 200 can no longer slide axially, so the DIN rail 200 can no longer release from the fastening device 100. If the DIN rail 200 is to be released again, a pressure force D can be applied to the securing lug 128 from above in order to release the securing lug 128 from the latching to the edge portion 215 of the DIN rail 200, such that the securing lug 128 is pushed out of the opening 211 at least in some regions and the DIN rail 200 can thus be freely slid again.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

100 Fastening device
101 Fastening element
102 Securing element
103 DIN rail fastening portion
104 Wall fastening portion
105 Tongue and groove system
106 Recess
107 Flange
108 Opening
109 Retaining element
110 Wall fastening portion
111 DIN rail fastening portion
112 Tongue and groove system
113 External circumferential surface
114 Recess
115 First wall surface
116 Second wall surface
117 Collar
118 Main body
119 Tool holder region
120 End face
121 Engagement pin
122 Underside
123 Top face
124 Flange
125 Top face
126 Opening
127 Retaining element
128 Securing lug
129 Stop surface
130 Centering rib
131 Edge region
200 DIN rail
210 Portion
211 Opening
212 Top face
213 Underside
214 End portion
215 Edge portion
216 Opening
300 Assembly
400 Wall
410 First opening
411 Second opening
V Sliding movement
M Central axis
E Horizontal plane
D Pressure force

The invention claimed is:

1. A fastening device for fastening a DIN rail to a wall, comprising:
   at least one fastening element comprising a wall fastening portion configured to fasten the fastening element to the wall, and a DIN rail fastening portion configured to fasten the fastening element to the DIN rail, the DIN rail fastening portion comprising a main body; and
   a collar that overlaps the main body at least in some regions, wherein, when in a fastened state, the DIN rail fastening portion is guided at least in some regions through an opening formed in the DIN rail,
   wherein the DIN rail fastening portion comprises a tongue and groove system into which a portion of the DIN rail is inserted in the fastened state,
   wherein the tongue and groove system comprises a recess formed in an external circumferential surface of the DIN rail fastening portion, and
   wherein the recess tapers from the external circumferential surface of the DIN rail fastening portion toward a central axis of the DIN rail fastening portion.

2. The fastening device of claim 1, wherein the recess is delimited by a first wall surface and by a second wall surface opposite the first wall surface, the first wall surface having a shape of a ramp.

3. The fastening device of claim 1, wherein the DIN rail fastening portion comprises a tool holder region.

4. The fastening device of claim 1, wherein the DIN rail fastening portion comprises one piece with the wall fastening portion.

5. The fastening device of claim 1, wherein the wall fastening portion comprises an engagement pin configured to engage in a first opening formed in the wall.

6. The fastening device of claim 1, further comprising:
   a retaining element which, in the fastened state, is retained on a flange of the wall fastening portion and engages in a second opening formed in the wall.

7. The fastening device of claim 1, further comprising:
   a securing element arranged separately from the fastening element.

8. The fastening device of claim 1, wherein the DIN rail fastening portion comprises a securing lug configured to engage in the opening in the DIN rail in the fastened state.

9. The fastening device of claim 8, wherein the securing lug is formed in a spring-loaded manner.

10. The fastening device of claim 8, wherein the securing lug comprises a stop surface against which an edge portion, which delimits the opening, of the DIN rail rests in the fastened state.

11. The fastening device of claim 6, wherein the flange comprises two centering ribs extending in parallel with one another for orienting the DIN rail on the fastening element.

12. A method for fastening a DIN rail to a wall by the fastening device of claim 1, comprising:
   fastening the at least one fastening element of the fastening device to the wall by the wall fastening portion;
   guiding the at least one fastening element of the fastening device by the DIN rail fastening portion, at least in some regions through an opening formed in the DIN rail; and
   then inserting the DIN rail into the tongue and groove system of the DIN rail fastening portion by a portion of the DIN rail using a sliding movement.

13. An assembly, comprising:
   a DIN rail; and
   the fastening device of claim 1,
   wherein the DIN rail is fastened to the wall by the fastening device.

14. A switchgear cabinet, comprising:
   at least one assembly of claim 13 fastened to a wall of the switchgear cabinet.

15. The fastening device of claim 2, wherein the second wall surface is formed on the collar.

16. The fastening device of claim 15, wherein the first wall surface is formed on the main body.

17. The fastening device of claim 2, wherein the first wall surface is formed on the main body.

18. The fastening device of claim 1, wherein the collar is circular at least in some regions.

19. The fastening device of claim 1, wherein the main body is formed on the collar so as to be off-center with respect to the collar.

\* \* \* \* \*